(12) United States Patent
Frey et al.

(10) Patent No.: US 7,682,703 B2
(45) Date of Patent: Mar. 23, 2010

(54) MICROFABRICATION USING PATTERNED TOPOGRAPHY AND SELF-ASSEMBLED MONOLAYERS

(75) Inventors: Matthew H. Frey, Cottage Grove, MN (US); Khanh P. Nguyen, St. Paul, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 511 days.

(21) Appl. No.: 11/564,582

(22) Filed: Nov. 29, 2006

(65) Prior Publication Data

US 2007/0098996 A1    May 3, 2007

Related U.S. Application Data

(62) Division of application No. 11/003,233, filed on Dec. 3, 2004, now Pat. No. 7,160,583.

(51) Int. Cl.
*B32B 27/00* (2006.01)
*B29D 7/00* (2006.01)

(52) U.S. Cl. .................. 428/544; 428/333; 428/618; 428/422; 427/437; 427/435; 427/436; 264/212

(58) Field of Classification Search .................. None
See application file for complete search history.

(56) References Cited

U.S. PATENT DOCUMENTS

| | | |
|---|---|---|
| 2,963,748 A | 12/1960 | Young |
| 3,075,280 A | 1/1963 | Jack et al. |
| 3,800,020 A | 3/1974 | Parfet |
| 3,891,514 A | 6/1975 | Klemm |
| 3,952,152 A | 4/1976 | Lill et al. |
| 4,179,797 A | 12/1979 | Johnson |
| 4,321,296 A | 3/1982 | Rougier |
| 4,381,421 A | 4/1983 | Coats et al. |
| 4,412,255 A | 10/1983 | Kuhlman et al. |
| 4,510,347 A | 4/1985 | Wiech, Jr. |
| 4,614,837 A | 9/1986 | Kane et al. |
| 4,748,130 A | 5/1988 | Wenham et al. |

(Continued)

FOREIGN PATENT DOCUMENTS

| | | |
|---|---|---|
| WO | WO 01/68940 A1 | 9/2001 |
| WO | WO 03/101704 | 12/2003 |

OTHER PUBLICATIONS

Asakura, S., et al., "Fabrication of microstructured copper on an indium-tin-oxide surface using a micropatterned self-assembled monolayer as a template", J. Vac. Sci. Technol., vol. 21, pp. 1152-1156, 2003.

(Continued)

*Primary Examiner*—Jennifer McNeil
*Assistant Examiner*—Vera Katz
(74) *Attorney, Agent, or Firm*—Douglas B. Little

(57) ABSTRACT

A method of selectively and electrolessly depositing a metal onto a substrate having a metallic microstructured surface is disclosed. The method includes forming a self-assembled monolayer on the metallic microstructured surface, exposing the self-assembled monolayer to an electroless plating solution including a soluble form of a deposit metal, and depositing electrolessly the deposit metal selectively on the metallic microstructured surface. Article formed from this method are also disclosed.

10 Claims, 5 Drawing Sheets

U.S. PATENT DOCUMENTS

| | | | |
|---|---|---|---|
| 4,756,850 | A | 7/1988 | Nayar |
| 4,865,954 | A | 9/1989 | Hagiwara et al. |
| 5,061,438 | A | 10/1991 | Lillie et al. |
| 5,094,811 | A | 3/1992 | Kane et al. |
| 5,399,879 | A | 3/1995 | Liu |
| 5,462,624 | A | 10/1995 | Kwon |
| 5,512,131 | A | 4/1996 | Kumar et al. |
| 5,514,501 | A | 5/1996 | Tarlov |
| 5,576,074 | A | 11/1996 | Weigel et al. |
| 5,595,943 | A | 1/1997 | Itabashi et al. |
| 5,922,397 | A * | 7/1999 | Brandt et al. ............ 427/97.5 |
| 5,932,150 | A | 8/1999 | Lacey |
| 6,037,005 | A | 3/2000 | Moshrefzadeh et al. |
| 6,096,247 | A | 8/2000 | Ulsh et al. |
| 6,403,397 | B1 * | 6/2002 | Katz ........................... 438/99 |
| 6,433,481 | B1 | 8/2002 | Marutsuka |
| 6,521,285 | B1 | 2/2003 | Biebuyck et al. |
| 6,544,885 | B1 * | 4/2003 | Nguyen et al. ............. 438/631 |
| 6,544,905 | B1 | 4/2003 | Krivokapic |
| 6,582,767 | B1 | 6/2003 | Fukushima et al. |
| 6,591,496 | B2 | 7/2003 | Koskenmaki et al. |
| 6,737,170 | B2 | 5/2004 | Fitch et al. |
| 6,788,463 | B2 | 9/2004 | Merrill et al. |
| 6,960,255 | B2 * | 11/2005 | Aizenberg ................... 117/54 |
| 2003/0021967 | A1 | 1/2003 | Sagiv et al. |
| 2003/0157245 | A1 | 8/2003 | Tatman et al. |
| 2003/0162316 | A1 | 8/2003 | Zangmeister et al. |
| 2004/0161873 | A1 * | 8/2004 | Dimitrakopoulos et al. ... 438/99 |
| 2004/0163758 | A1 * | 8/2004 | Kagan et al. ................ 156/230 |
| 2005/0110006 | A1 * | 5/2005 | Aizenberg et al. ............ 257/40 |
| 2006/0115623 | A1 * | 6/2006 | Aizenberg et al. .......... 428/141 |
| 2007/0077396 | A1 * | 4/2007 | Aizenberg et al. .......... 428/172 |

OTHER PUBLICATIONS

Davies, M.A., et al., "Application of precision diamond machining to the manufacture of micro-photonics components", Proc. of SPIE, vol. 5183, pp. 94-108, 2003.

Bigelow, W.C., et al., "Oleophobic Monolayers: I. Films Adsorbed From Solution in Non-Polar Liquids," Journal of Colloid Science, vol. 1, pp. 513-538, 1946.

Shafrin, E., et al., "Hydrophobic Monolayers Adsorbed From Aqueous Solutions," Journal of Colloid Science, vol. 4, pp. 571-590, 1949.

Schulman, F., et al., "The Spreading of Liquids on Low-Energy Surfaces. V. Perfluorodecanoic Acid Monolayers," Journal of Colloid Science, vol. 7, pp. 465-481, 1952.

Kley, E.B., "Continuous profile writing by electron and optical lithography", Microelectronic Engineering, vol. 34, 261-298, 1977.

Mallory, G.O., et al., Electroless Plating: Fundamentals and Applications, pp. 261-329 and 401-509, 1990.

Pellerite, M.J., et al., "Effects of Fluorination on Self-Assembled Monolayer Formation from Alkanephosphonic Acids on Aluminum: Kinetics and Structure", Journal of Physical Chemistry B, vol. 107, pp. 11726-11736, 2003.

Quake, S.R., et al., "From Micro-to Nanofabrication with Soft Materials," Science, vol. 290, pp. 1536-1540, 2000.

Schaeffer, V.J., et al., "Surface Replicas for Use in the Electron Microscope," Journal of Applied Physics, vol. 13, pp. 427-433, 1942.

Breen, T., et al., "Patterning Indium Tin Oxide and Indium Zinc Oxide Using Microcontact Printing and Wet Etching", Langmuir, vol. 18, pp. 194-197, 2002.

Ulman, A., "Formation and Structure of Self-Assembled Monolayers," Chem. Rev., vol. 96, pp. 1533-1554, 1996.

Ulman, Ed., "Self-Assembled Monolayers of Thiols," Thin Films, vol. 24, pp. 1-80, 1998.

Aizenberg, J., et al., "Controlling local disorder in self-assembled monolayers by patterning the topography of their metallic supports", Nature, vol. 394, pp. 868-871, 1998.

Black, A. J., et al., "Patterning Disorder in Monolayer Resists for the Fabrication of Sub-100-nm Structures in Silver, Gold, Silicon, and Aluminum", J. Amer. Chem. Soc., vol. 121, pp. 8356-8365, 1999.

Yang, H., et al., "Electroforming of Copper Structures at Nanometer-Sized Gaps of Self-assembled Monolayers on Silver", Chem. Mater., vol. 14, pp. 1385-1390, 2002.

Aizenberg, J., "Patterned crystallization on self-assembled monolayers with integrated regions of disorder", J. Chem. Soc., pp. 3963-3968, 2000.

Yu, H-Z., et al., "Templated Electrochecmical Deposition of Zirconia Thin Films on 'Recordable CDs'", Analytical Chemistry, vol. 74, pp. 5742-5747, 2002.

* cited by examiner

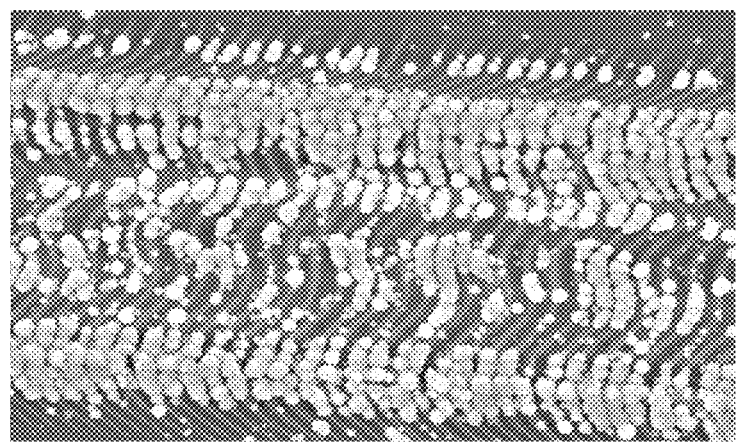
*Fig. 5*  1 μm
*Fig. 6*

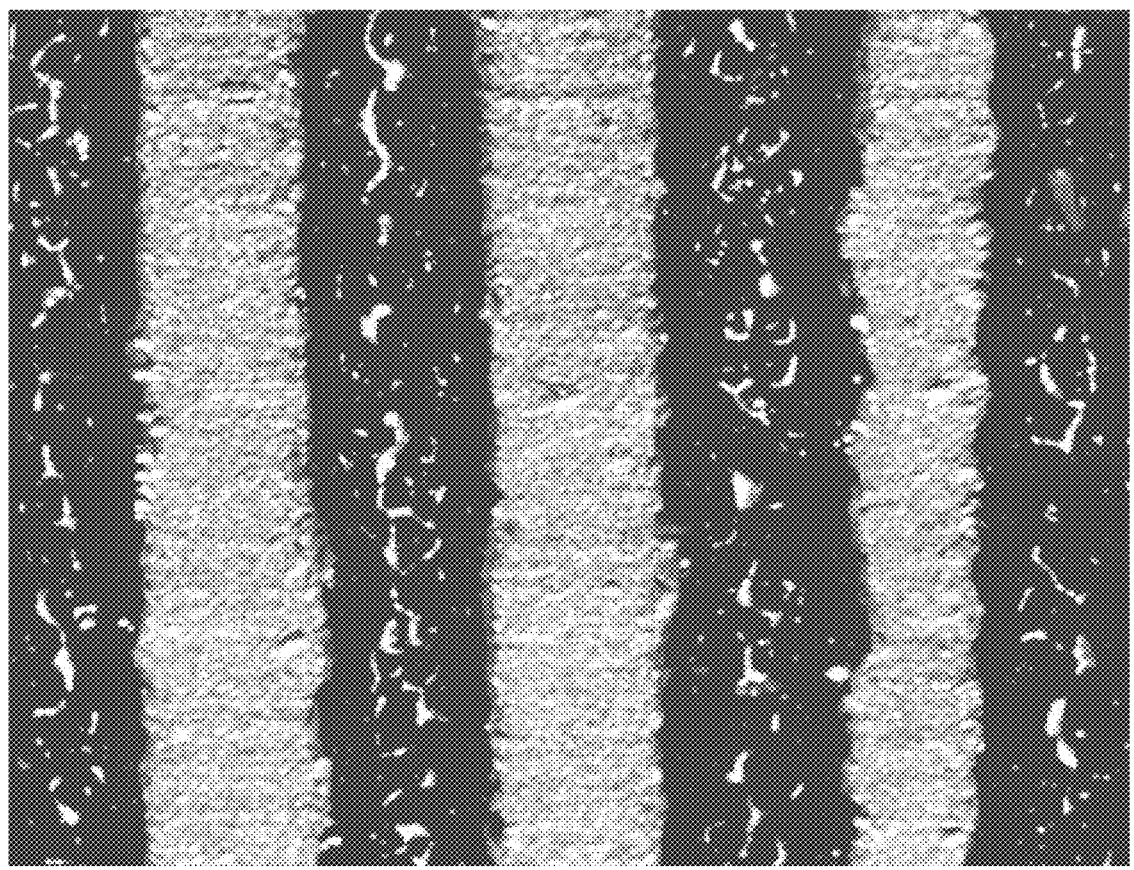
Fig. 7        1 mm

MICROFABRICATION USING PATTERNED TOPOGRAPHY AND SELF-ASSEMBLED MONOLAYERS

This application is a divisional of U.S. Ser. No. 11/003,233, filed Dec. 3, 2004, now U.S. Pat. No. 7,160,583 now allowed, the disclosure of which is incorporated by reference in its entirety herein.

BACKGROUND

The present disclosure relates to a method of fabricating patterned metallic deposits on substrates and the articles so fabricated.

Polymeric films with patterns of metallic material have a wide variety of commercial applications. In some instances, it is desired that a conductive grid be sufficiently fine to be invisible to the unaided eye and supported on a transparent polymeric substrate. Transparent conductive sheets have a variety of uses including, for example, resistively heated windows, electromagnetic interference (EMI) shielding layers, static dissipating components, antennas, touch screens for computer displays, and surface electrodes for electrochromic windows, photovoltaic devices, electroluminescent devices, and liquid crystal displays.

The use of essentially transparent electrically conductive grids for such applications as EMI shielding is known. The grid can be formed from a network or screen of metal wires that are sandwiched or laminated between transparent sheets or embedded in substrates (U.S. Pat. Nos. 3,952,152; 4,179,797; 4,321,296; 4,381,421; 4,412,255). One disadvantage of using wire screens is the difficulty in handling very fine wires or in making and handling very fine wire screens. For example, a 20 micron diameter copper wire has a tensile strength of only 1 ounce (28 grams force) and is therefore easily damaged. Wire screens fabricated with wires of 20 micron diameter are available but are very expensive due to the difficulty in handling very fine wire.

Rather than embed a preexisting wire screen into a substrate, a conductive pattern can be fabricated in-situ by first forming a pattern of grooves or channels in a substrate and then filling the grooves or channels with a conductive material. This method has been used for making conductive circuit lines and patterns by a variety of means, although usually for lines and patterns on a relatively coarse scale. The grooves can be formed in the substrate by molding, embossing, or by lithographic techniques. The grooves can then be filled with conductive inks or epoxies (U.S. Pat. No. 5,462,624), with evaporated, sputtered, or plated metal (U.S. Pat. Nos. 3,891,514; 4,510,347; and 5,595,943), with molten metal (U.S. Pat. No. 4,748,130), or with metal powder (U.S. Pat. Nos. 2,963,748; 3,075,280; 3,800,020; 4,614,837; 5,061,438; and 5,094,811). Conductive grids on polymer films have been made by printing conductive pastes (U.S. Pat. No. 5,399,79) or by photolightography and etching (U.S. Pat. No. 6,433,481). These prior art methods have limitations. For example, one problem with conductive inks or epoxies is that the electrical conductivity is dependent on the formation of contacts between adjacent conductive particles, and the overall conductivity is usually much less than that of solid metal. Vapor deposition of metal or electroplating is generally slow and often requires a subsequent step to remove excess metal that is deposited between the grooves. Molten metal can be placed in the grooves but usually requires the deposition of some material in the grooves that the metal will wet. Otherwise the molten metal will not penetrate nor stay in the grooves due to surface tension of the molten metal.

Circuits have been made by placing metal powder into grooves followed by compacting the powder to enhance electrical contact between the particles. Lillie et al. (U.S. Pat. No. 5,061,438) and Kane et al. (U.S. Pat. No. 5,094,811) have used this method to form printed circuit boards. However, these methods are not practical for making fine circuits and fine metal patterns. One a fine scale, replacing or re-registering the tool over the embossed pattern to perform the metal compaction can be difficult. For example, a sheet with a pattern of 20 micron wide channels would require that the tool be placed over the pattern to an accuracy of roughly 3 microns from one side of the sheet to the other. For many applications, the sheet may be on the order of 30 cm by 30 cm. Dimensional changes due to thermal contraction of a thermoplastic sheet are typically about 1 percent or more during cooling from the forming temperature to room temperature. Thus, for a 30 cm by 30 cm sheet, a contraction of 1 percent would result in an overall shrinkage of 0.3 cm. This value is 1000 times larger than the 3 micron placement accuracy needed, making accurate repositioning of the tool difficult.

SUMMARY

The present disclosure relates to articles that include a substrate with a patterned metallic deposit. More specifically, the articles are prepared by selectively and electrolessly depositing a metal onto a substrate having a metallic microstructured surface.

A first aspect relates to a method that includes providing a substrate that has a metallic microstructured surface, forming a self-assembled monolayer on the metallic microstructured surface, exposing the self-assembled monolayer to an electroless plating solution that contains a soluble form of a deposit metal, and depositing electrolessly the deposit metal selectively on the metallic microstructured surface.

Various methods can be used to form the substrate with a metallic microstructured surface. In one embodiment, the microstructure can be formed on a metallic surface with a mechanical tool. The mechanical tool can emboss, scribe, or mold the microstructure onto the metallic surface. In a further embodiment, the microstructure can be formed in a substrate surface with a mechanical tool and then a metal layer can be disposed on the microstructured surface to form a metallic microstructured surface. The mechanical tool can emboss, scribe or mold the microstructure onto the substrate surface. In yet a further embodiment, the microstructure can be formed in a substrate surface by depositing a metal onto the substrate surface or by removing metal from a metallic substrate surface.

In another aspect, an article is provided. In one embodiment, the article includes a substrate having a substrate surface and a topographical feature disposed on the substrate surface. A continuous homogenous metal layer is disposed on the substrate surface adjacent the topographical feature and on the topographical feature. A self-assembled monolayer is disposed on the continuous homogenous metal layer, and a deposit metal is disposed on the continuous homogenous metal layer on the topographical feature, and is not disposed on the continuous homogenous metal layer surface adjacent the topographical feature.

In another embodiment, the article includes a substrate having a substrate surface and a topographical feature disposed on and extending away from the substrate surface. The topographical feature has a radius of curvature of 500 nanometers or less. A metal layer is disposed on the substrate surface adjacent the topographical feature and on the topographical feature. A self-assembled monolayer is disposed on the metal layer, and a deposit metal is disposed on the metal layer on the topographical feature, and not on the metal layer substrate surface adjacent the topographical feature.

The above summary of the present invention is not intended to describe each disclosed embodiment or every implementation of the present invention. The Figures, Detail Description and Examples that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 5 is a scanning electron photomicrograph of the resulting structure formed in Example 2;

FIG. 6 is a photograph of the resulting structure formed in Example 3; and

FIG. 7 is a photograph of the resulting structure formed in Example 4.

Figure 1:
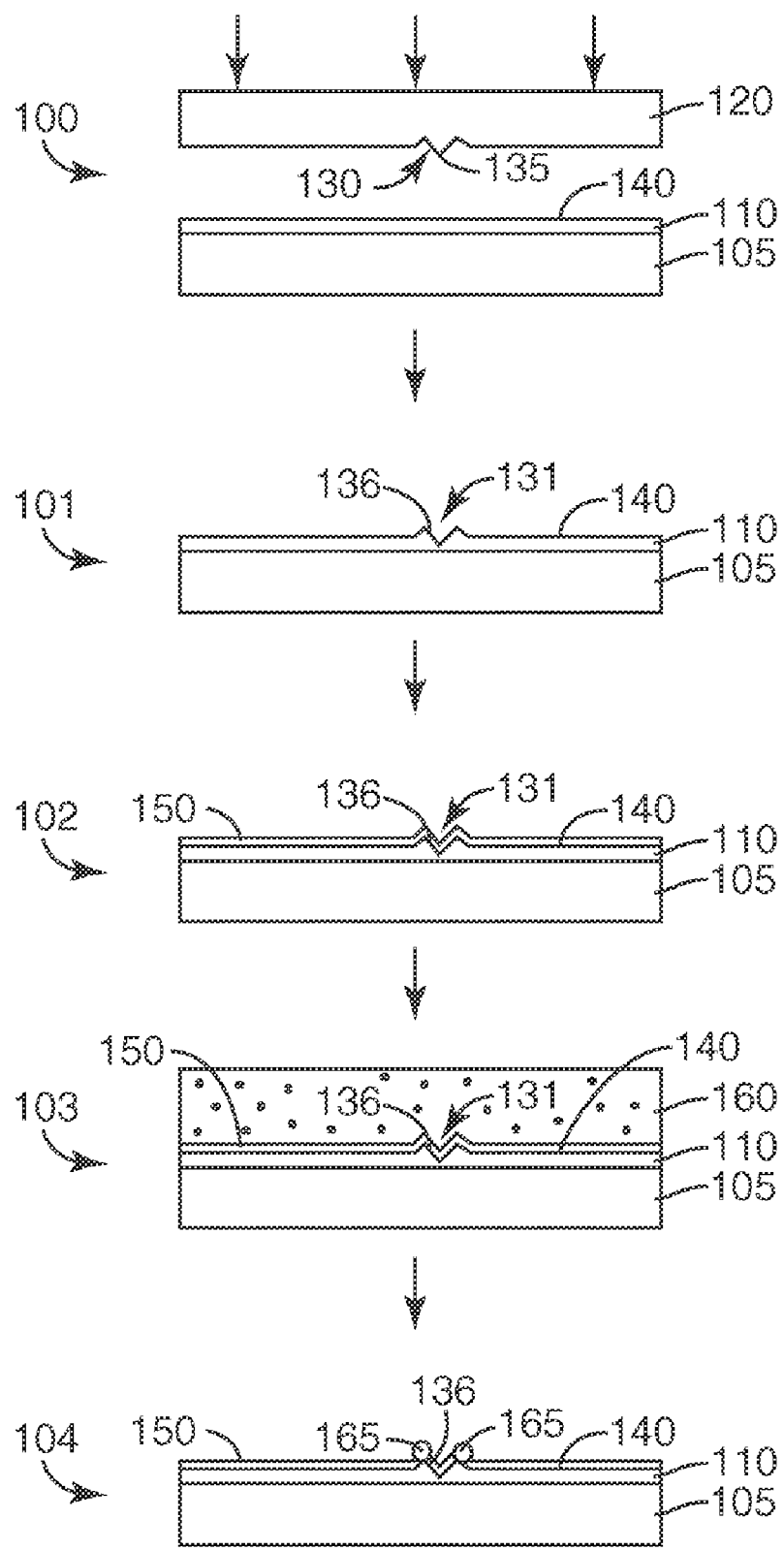
FIG. 1 is a schematic diagram of an illustrative method of microfabrication using patterned topography and self-assembled monolayers.

While the invention is amenable to various modifications and alternative forms, specifies thereof have been shown by way of example in the drawings and will be described in detail. It should be understood, however, that the intention is not to limit the invention to the particle embodiments described. On the contrary, the intention is to cover all modifications, equivalents, and alternatives falling within the spirit and scope of the invention.

DETAILED DESCRIPTION

The present disclosure relates to a method of fabricating patterned metallic deposits on substrates and the articles so fabricated. More specifically, metallic deposits are patterned on substrates having a metallic microstructured surface.

For the following defined terms, these definitions shall be applied, unless a different definition is given in the claims or elsewhere in this specification.

"Region" refers to a contiguous fractional portion of an entire surface, e.g., of a substrate surface.

The terms "deposit metal" and "metallic deposit" and "deposited metal" are used interchangeably and refer to a metal deposited on a substrate (i.e., a substrate having a metallic microstructured surface). The deposit metal is usually formed from an electroless plating solution. The deposit metal can be in the form of a pattern such as linear traces in an electrical circuit, contact pads on an electrical device, or large-area coatings.

A surface region can be described as having a microstructure or be a microstructured surface if it includes a topographical feature. A "topographical feature" refers to an intentional geometric deviation from smoothness for a substrate surface. It is understood that all surfaces exhibit some topography, according to a general definition of the term, topography. However, a "topographical feature," as used herein, does not include a number of types of incidental topography that will be familiar to those skilled in the art. A "topographical feature" does not include incidental variations in surface elevation on an atomic scale. A "topographical feature" also does not include the incidental, gradual changes in surface elevation that commonly exist over a large surface area, with respect to an average elevation over the same surface area. For example, "topographical features" do not include smoothly varying undulations with "peak-to-valley" height that is substantially smaller in size than their spatial separation. A surface that includes only the aforementioned incidental forms of topography is considered nominally smooth. A nominally smooth surface may be flat or curved, where the curvature is less than 0.1 (micrometer)$^{-1}$. A "topographical feature" can include a protrusive element, an intrusive geometric element, or both. An example of a linear protrusive geometric element that may exist as part of the topographical features of a substrate surface is a peaked ridge that extends above an otherwise nominally smooth surface. Another example of a linear protrusive geometric element that may exist as part of the topographical features of a substrate surface is a square ridge that extends above an otherwise nominally smooth surface. An example of a linear intrusive geometric element that may exist as part of the topographical features of a substrate surface is a groove, with square or triangular cross-section for example, that extends below an otherwise nominally smooth surface.

Depositing a metal "selectively," refers to depositing metal on one surface region and not depositing the metal on another surface region. For a metal to be deposited selectively on a substrate surface, it is not deposited on the entire substrate surface. That is, the deposit metal forms a pattern on the substrate surface. FIGS. 4 to 7 illustrate selective deposition of copper on a gold substrate surface. For example, the metal can be deposited on a topographical feature of a metallic surface i.e., the metal is not deposited in regions of the metallic surface that are nominally smooth).

The recitation of numerical ranges by endpoints includes all numbers subsumed within that range (e.g. 1 to 5 includes 1, 1.5, 2, 2.75, 3, 3.80, 4, and 5).

As used in this specification and the appended claims, the singular forms "a", "an", and "the" include plural referents unless the content clearly dictates otherwise. Thus, for example, reference to a composition containing "a metal" includes a mixture of two or more metals. As used in this specification and the appended claims, the term "or" is generally employed in its sense including "and/or" unless the content clearly dictates otherwise.

Unless otherwise indicated, all numbers used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviations found in their respective testing measurements.

The invention generally relates to methods for forming patterns of metallic deposits (i.e., deposit metal) on substrates having a metallic microstructured surface. In some embodiments, the deposit metal is electrolessly deposited on a substrate only in selected regions on the surface of the substrate. These selected regions can exhibit a regular or repeating geometric arrangement on the substrate, for example an array of polygons or a pattern of traces that define discrete undeposited areas that include an array of polygons. In other embodiments, the selected regions may exhibit a random arrangement on the substrate, for example a random net of traces that define the boundaries of irregular shapes for undeposited areas. In yet another embodiment, the selected regions may exhibit an arrangement that is not regular, repeating, or random, but that is a specified design which includes or lacks symmetry or repeating shapes. A deposit metal that is patterned may exist on only one region of the substrate surface or it may exist on more than one region of the substrate surface; but to be patterned it may not exist on all regions of the substrate surface.

A substrate with regions that include a microstructure and regions that do not include a microstructure can take a number of different forms. In one embodiment, the substrate surface may include adjacent regions which are each smooth and lacking topographical features, and that may lie parallel with each other, but that are elevated or depressed with respect to each other. This latter configuration necessarily leads to a type of transition region with slope and angles or high curvature with respect to the aforementioned smooth regions. The transition region can define a boundary between the smooth regions and be a topographical feature. In another embodiment, the substrate surface includes regions that are smooth and that lack microstructure, together with regions that can be described as having a microstructure in the form of a texture. This texture can include defined geometric elements such as ridges, pyramids, posts, or grooves. Alternatively, the texture may include randomly shaped geometric elements. Surface regions including microstructure where the microstructure is a texture can have associated with them a spatially averaged elevation with respect to the regions of the surface that are smooth, possibly flat, and lacking topographical features. Spatially averaged elevation of textured regions of the substrate surface may lied below or above the elevation of adjacent smooth and possibly flat regions of the substrate surface. Such textured regions can recess from or protrude from the adjacent regions, respectively.

A patterned metallic deposit on a substrate, where the arrangement of surface regions that include the metallic deposit is determined according to the topographical features of the substrate, may exhibit one of a number of spatial relationships to the topographical features. For example, for regions that include topographical features, each region can include a single geometric element spaced apart by adjacent regions that lack topographical features, and the patterned metallic deposit may be selectively deposited onto the individual topographical features. In such a case, the pattern of the metallic deposit would be substantially identical to the pattern of the individual topographical features. Alternatively, if topographical features are closely spaced in a region of the substrate, the metallic deposit may bridge individual geometric or topographical elements in the regions including topographical features. If a substrate surface includes regions with microstructure in the form of texture that is made up of multiple closely spaced topographical features, together with regions that lack such microstructure, a patterned metallic deposit may bridge the closely spaced topographical features leading to a contiguous deposit in the entire region with microstructure in the form of the texture.

Methods for generating articles with structured surfaces include, for example, the use of a mechanical tool, depositing material onto a substrate, or removing material from a substrate. Illustrative mechanical tools form a microstructured surface by embossing, scribing, or molding the microstructure onto the substrate surface.

A partial listing of illustrative methods for generating articles with structured surfaces includes diamond machining (M. A. Davies, C. J. Evans, S. R. Patterson, R. Vohra, and B. C. Bergner, "Application of Precision Diamond Machining to the Manufacture of Micro-photonics Components," *Proc. of SPIE* 5183 94-108 (2003)), optical lithography, e-beam lithography, x-ray lithography, laser beam writing, electron beam writing, and laser ablation (E. B. Kley, "Continuous Profile Writing by Electron and Optical Lithograph," *Microelectronic Engineering* 34 261-298 (1997)). Methods for generating a structured surface may include a step where material is exposed to light, X-rays, or electrons and then developed and selectively removed, or a step where a material is etched (Y. Hagiwara, N. Kimura, and K. Emori, U.S. Pat. No. 4,865,954 "Process for Formation of Metallic Relief" (1989)). Material (e.g., metal) can be selectively added onto the substrate surface, to form a structured surface, by convention methods including, for example, sputtering, vapor deposition, and the like. Material (e.g. metal) can be removed from the substrate to form a structured surface, by convention methods including, for example, etching and the like. These addition and removal methods can be combined with other methods such as, for example, photolithography methods and lift-off methods.

Particularly advantageous approaches for the preparation of a structured surface include replication or forming a microstructure with a mechanical tool. Mechanical tools form a microstructured surface by embossing, scribing, or molding the microstructure onto the substrate surface. Replication includes the transfer of surface structural feature from a master tool to another material and includes embossing or molding. Methods involving replication are noteworthy for the ease and speed with which materials with structured surfaces can be generated. Also noteworthy is the small size that can be achieved for surface structure features that are generated through replication. Nanoscale features with size less than 10 nanometers, can be replicated (S. R. Quake and A. Scherer, "From Micro- to Nanofabrication with Soft Materials," *Science* 290 1536-1540 (2000); V. J. Schaeffer and D. Harker, "Surface Replicas for Use in the Electron Microscope," *Journal of Applied Physics* 13, 427-433 (1942); and H. Zhang and G. M. Bensen, WO 0168940 A1, "Methods for replication, replicated articles, and replication tools" (2001)).

Replication can be achieved in any number of ways. One illustrative method for replicating the surface structural features of a master mechanical tool into the surface of another material is through thermal embossing (M. J. Ulsh, M. A. Strobel, D. F. Serino, and J. T. Keller, U.S. Pat. No. 6,0986,247 "Embossed Optical Polymeric Films" (2000); and D. C. Lacey, U.S. Pat. No. 5,932,150 "Replication of Diffraction Images in Oriented Films" (1999)). Thermal embossing involves the pressing of a master mechanical tool against a deformable material, causing the surface structure of the master tool to deform the surface of the deformable material, thereby generating a negative replica of that master tool surface. Materials that can be embossed with surface structure include, for example, soft metals and organic materials such as polymers. Examples of soft metals that can be embossed include indium, silver, gold, and lead. Polymers suitable for thermal embossing include thermoplastics. Examples of thermoplastics include polyolefins, polyacrylates, polyamides, polyimides, polycarbonates, and polyesters. Further examples of thermoplastics include polyethylene, polypropylene, polystyrene poly(methylmethacrylate), polycarbonate of bisphenol A. poly(vinyl chloride), poly(ethylene terephthalate), and poly(vinylidene fluoride). For the preparation of thermally embossed materials, it is often convenient and useful to start with material in film form. Optionally, a film for embossing can include multiple layers (J. Fitch, J. Moritz, S. J. Sargeant, Y. Shimizu, and Y. Nishigaki, U.S. Pat. No. 6,737,170 "Coated Film with Exceptional Embossing Characteristics and Methods for Producing It" (2004); and W. W. Merrill, J. M. Jonza, O. Benson, A. J. Ouderkirk, and M. F. Weber, U.S. Pat. No. 6,788,463, "Post-Formable Multilayer Optical Films and Methods of Forming" (2004)).

Another approach for replicating the surface structure of a master mechanical tool into the surface of polymer is to cure a flowable precursor to the polymer while in contact with the master mechanical tool. Curing a flowable precursor to a polymer while in contact with the master mechanical tool is one form of molding. Examples of flowable precursors include neat monomers, mixtures of monomers, solutions of monomers or polymers that may include removable solvent, and uncrosslinked polymers. Generally, a precursor to the cured polymer can be cast onto a master mechanical tool or into a mold, following by curing (J. A. Martens, U.S. Pat. No. 4,576,850 "Shaped Plastic Articles Having Replicated Microstructure Surfaces" (1986)). Curing refers to the development of increased elastic modulus, usually by way of a chemical reaction. Curing to develop elastic modulus can include heating, addition of a catalyst, addition of an initiator, or exposure to ultraviolet light, visible light, infrared light, X-rays, or an electron beam. Once the polymer has been cured, it can be removed as a solid from contact with the master tool or mold. Examples of polymers suitable for molding include polyacrylates, polyimides, epoxies, silicones, polyurethanes, and some polycarbonates.

Another illustrative method for generating a microstructure pattern on the surface of a substrate using a mechanical tool is by scribing. "Scribing" refers to the application of a stylus to an otherwise unstructured surface and pressing or translating the stylus on the surface, generating surface microstructure. A stylus tip may be made of any material such as, for example, a metal, ceramic, or polymer. A stylus tip may include diamond, aluminum oxide, or tungsten carbide. A stylus tip may also include a coating, for example a wear-resistant coating such as titanium nitride.

The substrate can be prepared from any suitable material. In some embodiments, the substrate is made of metal or organic materials such as polymers. Examples of metal include indium, silver, gold, and lead. Examples of polymers include thermoplastic polymers. Examples of thermoplastic polymers include polyolefins, polyacrylates, polyamides, polycarbonates, and polyesters. Further examples of thermoplastics include polyethylene, polypropylene, polystyrene, poly(methylmethacrylate), polycarbonate of bisphenol A. poly(vinyl chloride), poly(ethylene terephthalate), and poly(vinylidene fluoride).

In other embodiments, the substrate can be prepared from glasses, glass-ceramics, ceramics, semiconductors, or combinations thereof. Examples of useful glasses include silicates, germanates, phosphates, and chalcogenides. Among silicates, soda-lime-silica and borosilicate glasses can be useful. Fused silica also can be a useful substrate material Germanate and chalcogenide glasses are particularly useful for applications where increased infrared transmission is desired, compared with silicate glasses. Phosphate glasses generally exhibit conveniently low forming temperatures, but often also exhibit lower chemical durability. Other network-formers and modifiers in useful glasses include aluminum oxide, antimony pentoxide, tantalum oxide, niobium oxide, lead oxide, bismuth oxide, zinc oxide, magnesium oxide, strontium oxide, barium oxide, lithium oxide, and potassium oxide. Glass-ceramics that include a crystallized microstructure are also useful as substrate materials. Examples of useful glass-ceramics include lithium disilicate, beta-quartz, enstatite, cordierite, spinel, beta-spodumene, beta-eucryptite, and apatite compositions. Glass-ceramics offer the ease of glass-formability, together with high strength and toughness. Substrates can also include ceramics. Examples of useful ceramics include oxides, nitrides, borides, and carbides. Examples of useful ceramics include barium titanate, barium strontium titanate, lead zirconate titanate, bismuth titanate, aluminum oxide, beryllium oxide, aluminum nitride, silicon nitride, and silicon carbide. Substrates can also include semiconductors. Examples of useful semiconductors include Group IV elements, binary compounds of Group II and Group VI elements, binary compounds of Group III and Group V elements, and their various alloys. Some useful semiconductors include silicon, germanium, gallium arsenide, indium phosphide, zinc sulfide, and cadmium telluride. Substrates can be prepared from more than one class of these materials. For example, substrates can include a semiconductor crystal with a coating of a glass or ceramic material.

A "self-assembled monolayer" refers to a single layer of molecules that are attached (e.g., by a chemical bond) to a surface and that have adopted a preferred orientation with respect to that surface. Self-assembled monolayers have been shown to cover surfaces so completely that the properties of that surface are changed. For example, application of a self-assembled monolayer can result in a surface energy reduction.

Examples of chemical species that are suitable for forming self-assembled monolayers include organic compounds such as organosulfur compounds, silanes, phosphonic acids, benzotriazoles, and carboxylic acids. Examples of such compounds are discussed in the review by Ulman (A. Ulman, "Formation and Structure of Self-Assembled Monolayers," *Chem. Rev.* 96 1533-1554 (1996)). In addition to organic compounds, certain organometallic compounds are useful for forming self-assembled monolayers. Examples of organosulfur compounds that are suitable for forming self-assembled monolayers include alkyl thiols, dialkyl disulfides, dialkyl sulfides, alkyl xanthates and dialkylthiocarbamates. Examples of silanes that are suitable for forming self-assembled monolayers include organochlorosilanes and organoalkoxysilanes. Examples of phosphonic acid molecules that are suitable for forming self-assembled monolayers are discussed by Pellerite et al. (M. J. Pellerite, T. D. Dunbar, L. D. Boardman, and E. J. Wood, "Effects of Fluorination on Self-Assembled Monolayer formation from Alkanephosphonic Acids on Aluminum: Kinetics and Structure," *Journal of Physical Chemistry B* 107 11726-11736 (2003)). Chemical species that are suitable for forming self-assembled monolayers can include, for example, hydrocarbon compounds, partially fluorinated hydrocarbon compounds, or perfluorinated compounds. The self-assembled monolayer can include two or more different chemical species. In the use of two or more different chemical species, the chemical species may exist in the self-assembled monolayer as a mixture or with a phase-separated morphology.

Illustrative useful molecules for forming a self-assembled monolayer include, for example, $(C_3\text{-}C_{20})$alkyl thiols, $(C_{10}\text{-}$ $C_{20}$)alkyl thiols or ($C_{15}$-$C_{20}$)alkyl thiols. The alkyl groups can be linear or branched and can be substituted or unsubstituted with substituents that do not interfere with the formation of a self-assembled monolayer.

The self-assembled monolayer can be formed on a metal surface using a variety of methods. For example, the metal surface can be dipped into a solution that contains the chemical species, the metal surface can be sprayed with a solution that contains the chemical species, or the metal surface can be exposed to the chemical species in a vapor phase. Any excess of the chemical species that is not attached to the metal surface can be removed, for example, by rinsing with a suitable solvent.

Metallic surfaces can be used to support a self-assembled monolayer. The metal surface can include, for example, elemental metal, metal alloys, intermetallic compounds, metal oxides, metal sulfides, metal carbides, metal nitrides, and combinations thereof. Exemplary metallic surfaces for supporting self-assembled monolayers include gold, silver, palladium, platinum, rhodium, copper, nickel, iron, indium, tin, tantalum, as well as mixtures, alloys, and compounds of these elements.

The term "electroless deposition" refers to a process for the autocatalytic plating of metals. It typically involves the use of an electroless plating solution that contains a soluble form of the deposit metal together with a reducing agent. The soluble form of the deposit metal is usually an ionic species or a metal complex (i.e., a metal species coordinated to one or more ligands). In may embodiments, electroless deposition does not include the application of electrical current to a work piece that is being coated. The volume by Mallory and Hajdu describes the process in detail (*Electroless Plating—Fundamentals and Applications*, Ed. G. O. Mallory and J. B. Hajdu, William Andrew Publishing, Norwich (1990)). The steps involves in electroless plating include the preparation of a substrate with a catalytic surface (e.g., a metallic microstructured surface), followed by immersion of the substrate in an appropriate plating bath. The catalytic surface catalyzes the deposition of metal from solution. Once started, plating proceeds by the continued reduction of the solution metal source, catalyzed by its own metal surface, hence the term "autocatalytic." Metallic deposits that can be formed using electroless deposition include copper, nickel, gold, silver, palladium, rhodium, ruthenium tin, cobalt, zinc, as well as alloys of these metals with each other or with phosphorous or boron, as well as compounds of these metals with each other or with phosphorous or boron. Suitable reducing agents include, for example, formaldehyde, hydrazine, aminoboranes, and hypophosphite. Suitable metallic microstructured surfaces for catalysis of electroless deposition include palladium, platinum, rhodium, silver, gold, copper, nickel, cobalt, iron, and tin, as well as alloys and compounds of the elements with each other or with other elements. The deposit metal and the metal included in the metallic microstructure surface can be the same or different.

Not wishing to be bound by any particular theory, it is presumed that a topographical feature on a surface can be sufficiently disruptive to the structure of a self-assembled monolayer attached to the surface such that the ability of the self-assembled monolayer to alter the properties of that surface is compromised. For example, a gold surface is known to have the property of supporting self-assembled monolayers and the property of catalyzing electroless deposition of metals. In the past, it has been shown that a self-assembled monolayer on gold will block its catalytic activity with regard to electroless plating (A. Kumar and G. M. Whitesides, U.S. Pat. No. 5,512,131, "Formation of Microstamped Patterns on Surfaces and Derivative Articles," (1996)).

Further, it is presumed that the topographical features for a metal surface such as gold can interfere with that ability for self-assembled monolayers to block the catalytic activity, thus forming the basis for methods of patterning. The topographical features that lead to such apparent disruption in catalytic activity can be generated through the convenient methods of embossing, scribing, or molding.

FIG. 1 is a schematic diagram of an illustrative method of microfabrication using patterned topography and self-assembled monolayers. A substrate 105 includes a metal layer 110 disposed on the substrate 105. In one embodiment, the substrate 105 is formed from a polymeric material and the metal layer 110 is formed from a metal. In many embodiments, the metal layer 110 is a continuous homogenous metal layer. In one embodiment, the continuous homogenous metal layer 110 is formed from a single metal or alloy.

A mechanical tool 120 is shown having a topographical feature 130 formed on a first surface 135 of the mechanical tool 120. The mechanical tool 120 can be applied to a surface 140 of the metal layer 110 such that the mechanical tool 120 first surface 135 is in contact with the surface 140 of the metal layer 110. In one embodiment pressure (as shown by the downward arrows) is applied to the mechanical tool 120 such that a negative replica of the microstructure or topographical feature 120 is transferred to or embossed onto the surface 140 of the metal layer 110 forming a microstructure 131 on the metal layer 110 surface 140. This mechanically formed microstructure 131 is termed a metallic microstructured surface 136. A microstructured article 101 includes the substrate having a metallic microstructure surface 136.

A self-assembled monolayer 150 is formed 102 on the metallic microstructured surface 136, as described above. In this embodiment, the self-assembled monolayer 150 is shown disposed across the entire surface 140 of the metal layer 110. The self-assembled monolayer 150 can be uniformly disposed along the metal layer 110 surface 140. The self-assembled monolayer 150 can have areas of disruption on or adjacent to the microstructure 131. In at least some embodiments, the areas of disruption on or adjacent to the microstructure 131 are caused by the microstructure 131 topography.

The self-assembled monolayer 150 is exposed 103 to an electroless plating solution 160 including a soluble form of a deposit metal. The deposit metal can be deposited 104 selectively on the metallic microstructured surface 136 to form a deposit metal pattern 165. In one embodiment, the deposit metal includes copper and the metallic microstructured surface 136 is formed from gold. In some embodiments, at least a portion of the metal layer 110 can be removed via etching after deposition of the deposit metal.

While not wishing to be bound by any particular theory, it is believed that the areas of disruption in the self-assembled monolayer 150 allow the deposit metal to bond with the metal layer 140 at the disruption areas formed on or near the microstructures 131.

Figure 2:
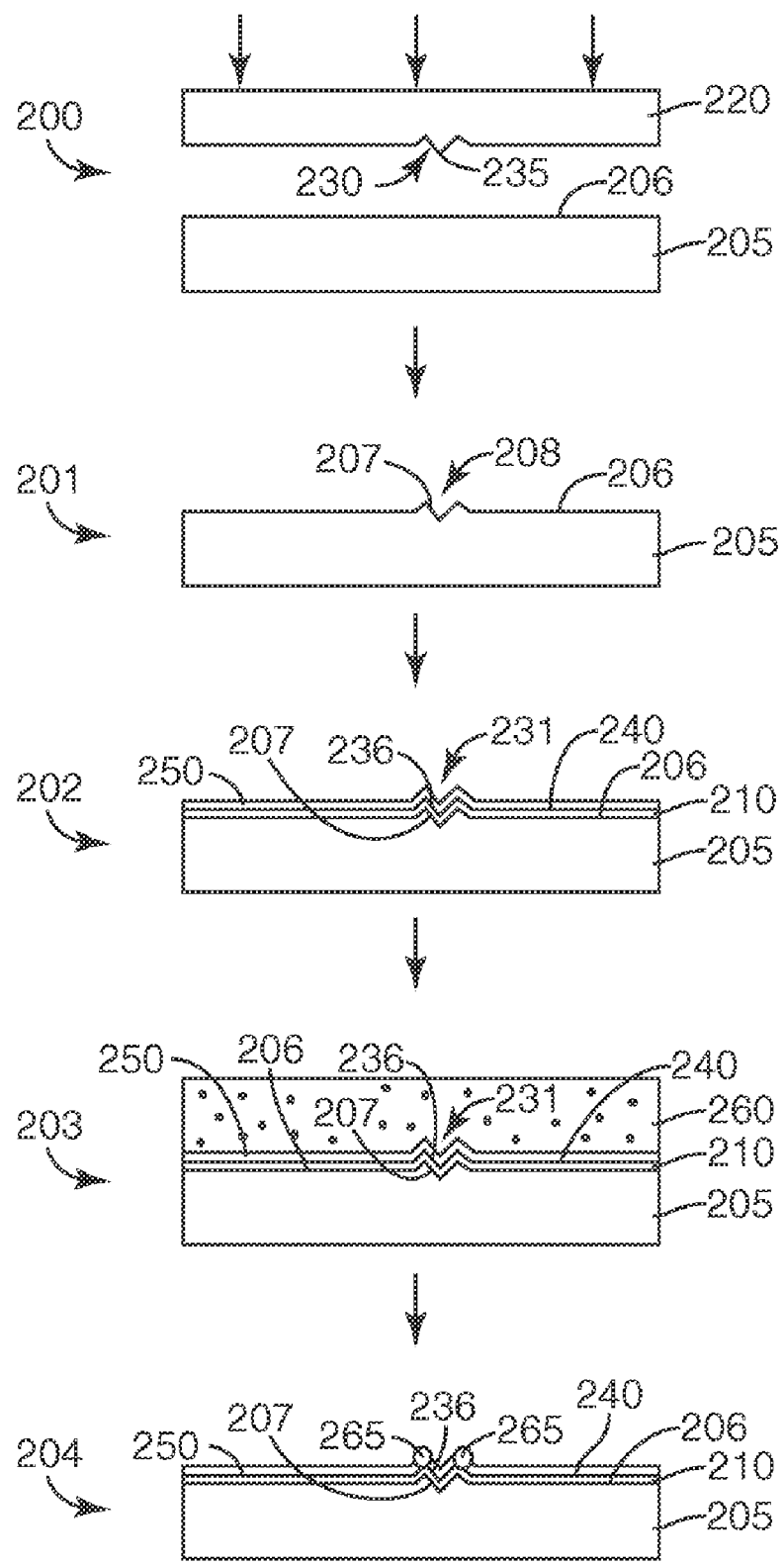
FIG. 2 is a schematic diagram of another illustrative method of microfabrication using patterned topography and self-assembled monolayers.

FIG. 2 is a schematic diagram of another illustrative method of microfabrication using patterned topography and self-assembled monolayers. A mechanical tool 220 is shown having a topographical feature 230 formed on a first surface 235 of the mechanical tool 220. The mechanical tool can be applied to a surface 206 of a substrate 205 such that the mechanical tool 220 first surface 235 is in contact with the surface 206 of the substrate 205. In one embodiment pressure (as shown by the downward arrows) is applied to the mechanical tool 220 such that the microstructure or topographical feature 230 is transferred to the surface 206 of the substrate 205 forming 201 a microstructure 208 on the substrate 205 surface 206. This mechanically formed microstructure 208 is termed a substrate microstructured surface 207.

A metal layer 210 is then disposed 202 on the substrate microstructured surface 207 to form a metallic microstructured surface 236. In one embodiment, the substrate 205 is formed from a polymeric material and the metal layer 20 is formed from a metal. In many embodiments, the metal layer 210 is a continuous homogenous metal layer. In one embodiment, the continuous homogenous metal layer 210 is formed from a single metal or alloy.

A self-assembled monolayer 250 is formed 202 on the metallic microstructured surface 236, as described above. The self-assembled monolayer 250 is shown disposed on the entire surface 240 of the metal layer 210. In one embodiment, the self-assembled monolayer 250 is uniformly disposed along the metal layer 210 surface 240. The self-assembled monolayer 250 can have areas of disruption on or adjacent to the microstructure 231. In at least some embodiments, the areas of disruption on or adjacent to the microstructure 231 are be caused by the microstructure 231 topography.

The self-assembled monolayer 250 is exposed 203 to an electroless plating solution 260 including a soluble form of a deposit metal. The deposit metal can be deposited 204 selectively on the metallic microstructured surface 236 to form a deposit metal pattern 265. In one embodiment, the deposit metal includes copper and the metallic microstructured surface 236 is formed from gold. In some embodiments, at least a portion of the metal layer 210 can be removed via etching after deposition of the deposit metal.

While not wishing to be bound by an particular theory, it is believed that the areas of disruption in the self-assembled monolayer 250 allow the deposit metal to bond with the metal layer 240 at the disruption areas formed on or near the microstructures 231.

Figure 3:
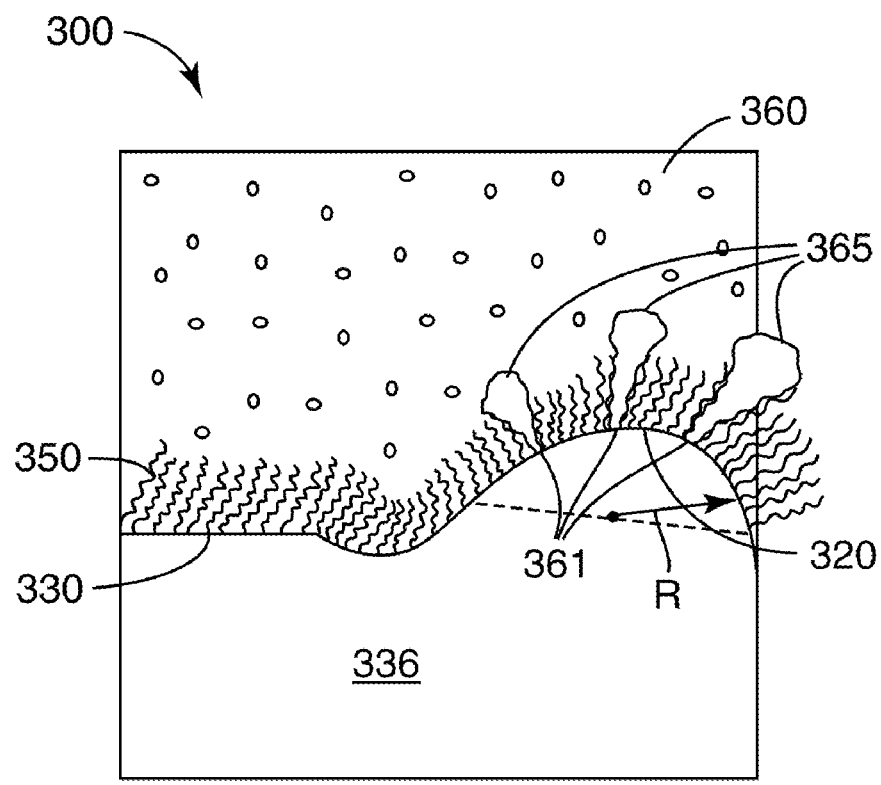
FIG. 3 is a schematic cross-sectional view of an illustrative microstructure with deposit metal formed on the microstructure.

FIG. 3 is a schematic cross-sectional view of an illustrative microstructure with deposit metal 365 formed on the microstructure. A metallic microstructured surface 336 includes a smooth region 330 adjacent a topographical feature 320. The topographical feature 320 is shown as a protrusive feature extending away from the substrate. In this embodiment, the smooth region 330 and the topographical feature 320 are formed of a single continuous homogenous metal layer 336. A self-assembled monolayer 350 is disposed on the single continuous homogenous metal layer 336. A deposit metal 365 is selectively formed at areas of disruption 361 on the topographical feature 320 via an electroless plating bath 360.

In some embodiments, the topographical feature 30 extends away from the substrate and has a radius of curvature R of 500 nanometers or less, or from 5 to 500 nanometers, or from 10 to 500 nanometers, or from 20 to 250 nanometers, or from 50 to 200 nanometers. The radius of curvature R can be measured, for example, with the aid of a scanning probe microscope, for example an atomic force microscope.

In many embodiments, useful topographical features that protrude from the substrate surface can have height ranging from 1 nanometers to 100 micrometers, or from 10 nanometers to 10 micrometers, or from 20 nanometers to 1 micrometer.

The deposit metal may be described as having an area shape and an area size on the substrate surface as well as a thickness. The area shape of the deposit metal can exhibit a regular or repeating geometric arrangement on the substrate, for example an array of deposit metal polygons or a pattern of deposit metal traces that define the boundaries of discrete undeposited areas that include an array of polygons. In other embodiments, the deposit metal shapes may exhibit a random arrangement on the substrate, for example a random net of traces that define the boundaries of irregular shapes for undeposited areas. In yet another embodiment, the deposit metal shapes may exhibit an arrangement that is not regular, repeating, or random, but that is a specified design which includes or lacks symmetry or repeating geometric elements. In one embodiment, a shape for the deposit metal that is useful for making a light-transmitting, EMI shielding material is a square grid, which includes traces of the deposit metal characterized by a width, thickness, and pitch. Other useful shapes for making a light-transmitting, EMI shielding material include continuous metallic traces that define open areas that have the shape of a regular hexagon and that are arranged in closely packed order.

In some embodiments, the smallest area dimension for the deposit metal shapes, for example the width of a linear trace of deposit metal, can range from 1 nanometer to 1 millimeter or from 10 nanometers to 50 micrometers, or from 100 nanometers to 25 micrometers, or from 1 micrometer to 15 micrometers. In one illustrative embodiment for making a light-transmitting EMI shielding material, the width of linear traces of deposit metal is in a range from 5 micrometers to 15 micrometers, the thickness is in a range from 1 micrometer to 5 micrometers, and the pitch is in the range from 25 micrometers to 1 millimeter. The largest area dimension for the deposit metal shapes above, for example the length of a linear trace of deposit metal, can range from 1 micrometer to 5 meters, or from 10 micrometers to 1 meter. For making a light-transmitting EMI shielding material, a sheet of EMI shielding material, the length of linear traces of deposit metal can be in the range from 1 centimeter to 1 meter, for example.

The present invention should not be considered limited to the particular examples described herein, but rather should be understood to cover all aspects of the invention as fairly set out in the attached claims. Various modifications, equivalent processes, as well as numerous structures to which the present invention can be applicable will be readily apparent to those of skill in the art to which the present invention is directed upon review of the instant specification.

EXAMPLES

Unless otherwise noted, chemical reagents and solvents were or can be obtained from Aldrich Chemical Co., Milwaukee, Wis.

As used herein, "FM-2" refers to gold-coated poly(ethylene terephthalate) film available from CPFilms, Canoga Park, Calif.

Electroless Copper Plating Solution

An electroless copper plating solution was prepared by combining deionized water (199.29 g), cupric sulfate pentahydrate (1.50 g), sodium hydroxide (1.35 g), formaldehyde (1.32 g of a 37 weight percent aqueous solution, available from Mallinckrodt Baker Inc., Phillipburg, N.J.), N,N,N',N'-tetrakis(2-hydroxypropyl)ethylenediamine (2.31 g; available from Lancaster Synthesis Inc., Pelham, N.H.), ethylenediaminetetraacetic acid (1.7 g), and 2,2'-bipyridine (0.03 g). The pH of the resultant solution was adjusted to 12.3 using 2.0 moles per liter aqueous sodium hydroxide solution. The plating solution was used at a temperature of 68° C.

Example 1

Deposition of Copper on a Substrate Patterned by Mechanical Scribing

Figure 4:
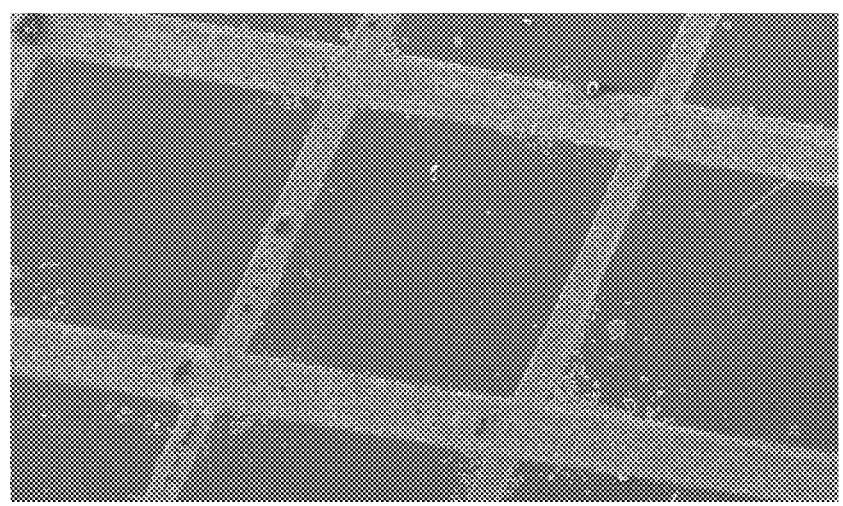
FIG. 4 is a scanning electron photomicrograph of the resulting structure formed in Example 1.

The gold coating of a 1 inch (25.4 mm) by 1.5 inch (38.1 mm) sample of FM-2 was scribed in a rectangular grid pattern using an OMNISCRIBE diamond-tipped scribe (available from Lunzer, Inc., Saddle Brook, N.J.). The film sample was immersed in a 0.1 weight percent solution of 1-octadecanethiol in ethanol for 2 minutes, after which time it was rinsed with ethanol. The film sample was then immersed in the electroless copper plating solution at 68° C. After 30 minutes, the film sample was removed from the electroless copper plating solution, rinsed with deionized water, and allowed to dry in air at room temperature. A portion of the surface of the sample is shown in FIG. 4. In FIG. 4, the light-tinted regions are regions where copper was deposited.

The film sample was then immersed for approximately 15 seconds in a solution made by dissolving potassium iodide (2 g) and then iodine (1 g) in deionized water (40 mL) to remove by etching the exposed gold coating on the film. The film sample was then rinsed with deionized water and was allowed to dry in air at room temperature.

Example 2

Deposition of Copper on a Substrate Patterned by Mechanical Scribing

The gold coating of a 1 inch (25.4 mm) by 1.5 inch (38.1 mm) sample of FM-2 was randomly scribed using a CUT-CAT rotary paper trimmer (available from Dahle North America, Inc. Peterborough, N.H.). The film sample was immersed in a 0.1 weight percent solution of 1-octadecanethiol in ethanol for 2 minutes, after which time it was rinsed with ethanol. The film sample was then immersed in the electroless copper plating solution at 68° C. After 30 minutes, the film sample was removed from the electroless copper plaint solution, rinsed with deionized water, and allowed to dry in air at room temperature. A portion of the surface of the sample is shown in FIG. 5. In FIG. 5, the light-tinted regions are regions where copper was deposited.

Example 3

Deposition of Copper on a Substrate Patterned by Mechanical Scribing

The gold coating of a 1 inch (25.4 mm) by 1.5 inch (38.1 mm) sample of FM-2 was scribed in a pattern of approximately parallel lines using a rotary glass cutter (available from Fletcher-Terry Co., Farmington, Conn.). The film sample was partially immersed in a 0.1 weight percent solution of 1-octadecanethiol in ethanol for 2 minutes, after which time it was rinsed with ethanol. The film sample was then partially immersed in the electroless copper plating solution at 68° C. After 30 minutes, the film sample as removed from the electroless copper plating solution, rinsed with deionized water, and allowed to dry in air at room temperature. The surface (i.e., the entire surface) of the sample is shown in FIG. 6. In FIG. 6, the light-tinted approximately parallel lines are regions where copper was deposited.

Example 4

Deposition of Copper on a Substrate Patterned by Embossing

A glass embossing tool was made by etching a pattern onto a glass plate. A glass plate having dimensions of 12.7 cm by 7.6 cm by 0.05 cm was covered on one surface with one layer of 3M Polyimide Film Tape 5413 (available from 3M Company, St. Paul, Minn.) in a region having dimensions of about 3 cm by 4 cm. After it was applied to the glass plate, the tape was cut with a razor blade to provide approximately 0.05 cm wide strips of tape at intervals of approximately 0.07 cm. The tape between the approximately 0.05 cm wide strips was removed, leaving the glass plate with a series of approximately 0.5 cm by approximately 4 cm strips of tape adhered to one surface. The glass plate was then submerged in a 25 weight percent aqueous solution of hydrofluoric acid for 10 minutes. After the glass plate was removed from the acid solution and was rinsed with water, it was allowed to dry in air at room temperature. The strips of polyimide tape were removed to reveal that the portion of glass plate that was not covered by the strips of tape was etched and removed by the hydrofluoric acid. The glass plate had a pattern of approximately 0.05 cm wide ridges that were approximately 0.06 cm high. The surface of the glass that included the ridges was lightly abraded using a Model Somaca BM-106G-RP24 belt sander (available from Sommer & Maca Industries, Chicago, Ill.) with a flexible M74 grade diamond belt (available from 3M Company, St. Paul, Minn.).

The glass embossing tool was used to make an embossed acrylic sheet by placing an approximately 3.8 cm by 7.6 cm by 0.3 cm piece of OPTIX acrylic sheet (available from Plaskolite, Inc. Columbus, Ohio) against the glass plate with the sheet contacting the pattern of ridges on the glass. The glass embossing tool and acrylic sheet assembly was placed between the heated platens of a Model AUTO M laminating press (available from Carver, Inc., Wabash, Ind.) at 130° C. for 30 minutes. Then, using the press, the glass embossing tool was pressed into the acrylic sheets using 3560 Newtons of force at a temperature of 130° C. for 20 minutes. After the glass/sheet assembly was removed from the press and the embossed sheet had cooled to room temperature, the embossed side of the acrylic sheet (that is, the side that was pressed against the glass embossing tool) was sequentially coated with 50 Angstroms of titanium and then 600 Angstroms of gold using a thermal evaporate or (available from Kurt J. Lesker Co., Pittsburgh, Pa.).

The metal coated embossed acrylic sheet was immersed in a 0.0 weight percent solution of 1-octadecanethiol in ethanol for 2 minutes, after which time it was rinsed with ethanol. The film sample was then immersed in the electroless copper plating solution at 68° C. After 30 minutes, the film sample was removed from the electroless copper plating solution., rinsed with deionized water, and allowed to dry in air at room temperature. A portion of the surface of the sample is shown in FIG. 7. In FIG. 7, the light-tinted regions are regions where copper was deposited.

What is claimed is:

1. An article comprising:
    a substrate having a substrate surface and a topographical feature comprising a protrusive and an intrusive element that is part of the substrate, said protrusive element having a height ranging from 1 nanometer to 100 micrometers above the surface disposed on the substrate surface;
    a continuous homogenous metal layer disposed on the substrate surface adjacent the topographical feature and on the topographical feature;
    a self-assembled monolayer disposed on the continuous homogenous metal layer; and
    a deposit metal disposed on the continuous homogenous metal layer on the topographical feature, and not disposed on the continuous homogenous metal layer substrate surface adjacent the topographical feature.

2. An article according to claim 1 wherein the substrate comprises a polymeric material.

3. An article according to claim 1 wherein the continuous homogenous metal layer comprises gold, silver, a gold alloy, or a silver alloy.

4. An article according to claim 1 wherein the deposit metal comprises copper or a copper alloy.

5. An article comprising:
a substrate having a substrate surface and a topographical feature, that is part of the substrate, disposed on and extending away from the substrate surface, the topographical feature having a height ranging from 10 nanometers to 10 micrometers above the surface and having a radius of curvature of 500 nanometers or less;
a metal layer disposed on the substrate surface adjacent the topographical feature and on the topographical feature;
a self-assembled monolayer disposed on the metal layer; and
a deposit metal disposed on the metal layer on the topographical feature, and not disposed on the metal layer substrate surface adjacent the topographical feature.

6. An article according to claim 5 wherein the topographical feature has a radius of curvature in a range of 50 to 250 nanometers.

7. An article according to claim 5 wherein the self-assembled monolayer comprises a $(C_3$-$C_{20})$alkyl thiol.

8. An article according to claim 5 wherein the substrate comprises a polymeric material.

9. An article according to claim 5 wherein the metal layer comprises gold, silver, a gold alloy, or a silver alloy.

10. An article according to claim 5 wherein the deposit metal comprises copper or a copper alloy.

* * * * *

UNITED STATES PATENT AND TRADEMARK OFFICE
CERTIFICATE OF CORRECTION

PATENT NO. : 7,682,703 B2     Page 1 of 2
APPLICATION NO. : 11/564582
DATED : March 23, 2010
INVENTOR(S) : Matthew H Frey It is certified that error appears in the above-identified patent and that said Letters Patent is hereby corrected as shown below:

On the Cover Page, in Column 2, under (Abstract)
Line 8, delete "Article" and insert -- Articles --, therefor.

Column 1
Line 54, delete "5,399,79)" and insert -- 5,399,879) --, therefor.
Line 55, delete "photolightography" and insert -- photolithography --, therefor.

Column 2
Line 7, delete "One" and insert -- On --, therefor.

Column 3
Line 6, delete "Detail" and insert -- Detailed --, therefor.
Line 37, delete "particle" and insert -- particular --, therefor.

Column 4
Line 36, delete "i.e.," and insert -- (i.e., --, therefor.

Column 5
Line 44, delete "lied" and insert -- lie --, therefor.
Line 67, after "features" insert -- , --.

Column 6
Line 17, delete "Lithograph,"" and insert -- Lithography," --, therefor.
Line 28, after "substrate" insert -- , --.
Lines 56–57, delete "6,0986,247" and insert -- 6,096,247 --, therefor.

Column 7
Line 5, after "polystyrene" insert -- , --.
Line 6, delete "A. poly" and insert -- A, poly --, therefor.
Line 27, delete "following" and insert -- followed --, therefor.
Line 57, delete "A." and insert -- A, --, therefor.

Signed and Sealed this

Eighteenth Day of May, 2010

David J. Kappos
*Director of the United States Patent and Trademark Office*

Column 8
Line 55, delete "formation" and insert -- Formation --, therefor.

Column 9
Line 30, delete "may" and insert -- many --, therefor.
Line 36, delete "involves" and insert -- involved --, therefor.
Line 45, after "ruthenium" insert -- , --.

Column 10
Line 27, delete "120" and insert -- 130 --, therefor.
Line 65, after "embodiment" insert -- , --.

Column 11
Line 8, delete "20" and insert -- 210 --, therefor.
Line 31, delete "an" and insert -- any --, therefor.
Line 47, delete "30" and insert -- 320 --, therefor.
Line 55, delete "nanometers" and insert -- nanometer --, therefor.
Line 59, after "surface" insert -- , --.

Column 12
Line 15, after "millimeter" insert -- , --.
Line 20, delete "micrometers," and insert -- micrometers; --, therefor.
Line 21, delete "micrometers," and insert -- micrometers; --, therefor.
Line 50, delete "Phillipburg," and insert -- Phillipsburg, --, therefor.
Line 53, delete "(1.7 g)," and insert -- (1.17 g), --, therefor.

Column 13
Line 30, delete "plaint" and insert -- plating --, therefor.
Line 48, delete "as" and insert -- was --, therefor.

Column 14
Line 20, delete "Inc." and insert -- Inc., --, therefor.
Line 33, delete "evaporate or" and insert -- evaporator --, therefor.
Line 36, delete "0.0" and insert -- 0.1 --, therefor.
Line 40, delete "solution.," and insert -- solution, --, therefor.